(12) United States Patent
Zhao

(10) Patent No.: US 11,996,549 B2
(45) Date of Patent: May 28, 2024

(54) SILICON MONOXIDE COMPOSITE MATERIAL, METHOD FOR PREPARING SAME, AND LITHIUM ION BATTERY

(71) Applicant: Hong Zhao, Hong Kong (HK)

(72) Inventor: Hong Zhao, Hong Kong (HK)

( * ) Notice: Subject to any disclaimer, the term of this patent is extended or adjusted under 35 U.S.C. 154(b) by 401 days.

(21) Appl. No.: 17/120,209

(22) Filed: Dec. 13, 2020

(65) Prior Publication Data

US 2022/0093915 A1  Mar. 24, 2022

(30) Foreign Application Priority Data

Sep. 23, 2020 (CN) .......................... 202011008024.3

(51) Int. Cl.
| | |
|---|---|
| *H01M 4/36* | (2006.01) |
| *C23C 16/02* | (2006.01) |
| *C23C 16/26* | (2006.01) |
| *H01M 4/04* | (2006.01) |
| *H01M 4/48* | (2010.01) |
| *H01M 4/587* | (2010.01) |
| *H01M 10/0525* | (2010.01) |
| *H01M 4/02* | (2006.01) |

(52) U.S. Cl.
CPC ......... *H01M 4/366* (2013.01); *C23C 16/0209* (2013.01); *C23C 16/26* (2013.01); *H01M 4/0428* (2013.01); *H01M 4/483* (2013.01); *H01M 4/587* (2013.01); *H01M 10/0525* (2013.01); *H01M 2004/027* (2013.01); *H01M 2220/20* (2013.01)

(58) Field of Classification Search
None
See application file for complete search history.

(56) References Cited

U.S. PATENT DOCUMENTS 9,450,248 B2 * 9/2016 Sheem .................. H01M 4/625

* cited by examiner

*Primary Examiner* — Wyatt P McConnell

(57) ABSTRACT

A method for preparing a silicon monoxide composite material includes: a first stage: introducing a protective gas into a vapor deposition oven, and pre-heating a silicon monoxide raw material, such that a part of the silicon monoxide raw material is subjected to a disproportionation reaction; a second stage: continuously introducing the protective gas and introducing a carbon source gas, and subjecting the pre-heated silicon monoxide raw material to a chemical vapor deposition to form carbon nanotubes on a surface of silicon monoxide; and a third stage: after a predetermined time period, stopping introducing the carbon source gas, and stopping introducing the protective gas until the vapor deposition oven is cooled to room temperature, to prepare the silicon monoxide composite material. During the preparation process, no extra catalyst needs to be added, a product of the previous disproportionation reaction may act as a catalyst for the growth of the carbon nanotubes.

19 Claims, 3 Drawing Sheets

SILICON MONOXIDE COMPOSITE MATERIAL, METHOD FOR PREPARING SAME, AND LITHIUM ION BATTERY

CROSS-REFERENCE TO RELATED APPLICATION

This disclosure is based upon and claims priority of Chinese Patent Application No. 202011008024.3, filed on Sep. 23, 2020, titled "SILICON MONOXIDE COMPOSITE MATERIAL, METHOD FOR PREPARING SAME, AND LITHIUM ION BATTERY", the entire contents of which are incorporated herein by reference.

TECHNICAL FIELD

Embodiments of the present disclosure relate to the technical field of materials, and in particular, relate to a silicon monoxide composite material, a method for preparing the same, and a lithium ion battery.

BACKGROUND

At present, graphite is generally used as a negative electrode material for lithium ion batteries due to advantages such as low cost, good cycle performance, and high initial coulombic efficiency. However, 372 mAh/g theoretical specific capacity fails to accommodate increasing requirements on energy density. For example, it is inevitable that cell electric vehicles would take place of fuel vehicles, and the electric vehicles have a low mileage due to insufficient energy density of the lithium ion batteries. As a result, consumers are less willing to accept and buy electric vehicles.

Stand-alone silicon material has a theoretical specific capacity reaching 4200 mAh/g, and silicon monoxide material has a theoretical specific capacity reaching 2100 mAh/g. Although composite negative electrode materials of silicon monoxide and graphite have been developed, such composite negative electrode materials are not widely used due to demerits of silicon monoxide such as poor electrical conductivity and low initial coulombic efficiency.

SUMMARY

Embodiments of the present disclosure provide a method for preparing a silicon monoxide composite material, including:

a first stage: introducing a protective gas into a vapor deposition oven, and pre-heating a silicon monoxide raw material, such that a part of the silicon monoxide raw material is subjected to a disproportionation reaction;

a second stage: continuously introducing the protective gas and introducing a carbon source gas, and subjecting the pre-heated silicon monoxide raw material to a chemical vapor deposition to form carbon nanotubes on a surface of silicon monoxide; and a third stage: after a predetermined time period, stopping introducing the carbon source gas, and stopping introducing the protective gas until the vapor deposition oven is cooled to room temperature, to prepare the silicon monoxide composite material.

During the preparation process, especially in the second stage, no extra catalyst needs to be added, a product of the previous disproportionation reaction may act as a catalyst for the growth of the carbon nanotubes.

In another aspect, embodiments of the present disclosure provide a silicon monoxide composition material prepared using the method described above, wherein a surface of silicon monoxide is partially covered or totally covered with a carbon coating layer comprising carbon nanotubes and a small amount of amorphous carbon, wherein the carbon nanotubes have a diameter in the range of 20 to 500 nm, and a mass ratio of the carbon nanotubes to the silicon monoxide is in the range of 1.0% to 50%.

In another aspect, embodiments of the present disclosure provide a lithium ion battery, wherein a negative electrode material of the lithium ion battery is prepared by mixing graphite with the silicon monoxide composition material described above.

DETAILED DESCRIPTION

Figure 1:
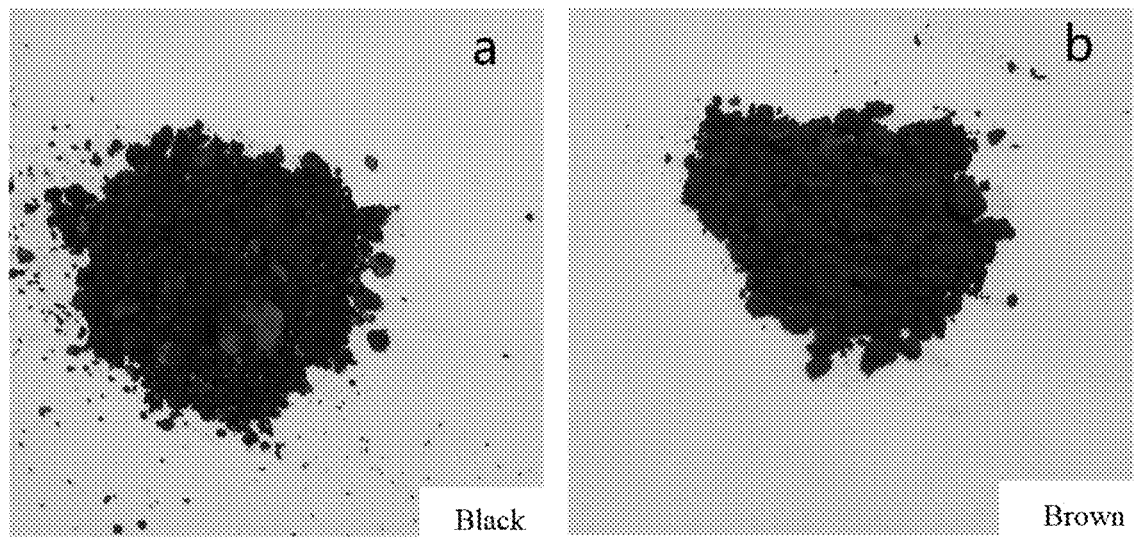
FIG. 1 illustrates pictures of silicon monoxide before and after reaction according to an embodiment of the present disclosure.

For better understanding of the present disclosure, the present disclosure is described in detail with reference to attached drawings and specific embodiments. Unless the context clearly requires otherwise, throughout the specification and the claims, technical and scientific terms used herein denote the meaning as commonly understood by a person skilled in the art.

Carbon nanotubes have excellent electrical conductivity, a chain structure and good flexibility. In multiple development trends of silicon-based materials, studies are conducted on improvement of the electrical conductivity of the silicon-based materials by carbon doping or carbon coating. In the related arts, the electrical conductivity of the silicon-based materials is enhanced in three ways. In a first way, carbon nanotubes are grown on the surface of silicon monoxide. However, additional catalysts need to be added, and hence the catalysts need to be removed by using strong acids, strong bases or by virtue of high temperature. As such, the procedures are complex, the cost is increased, and the structure of the carbon nanotubes may be damaged in the process of removing the catalysts. In a second way, carbon nanotubes are directly added in particles of silicon monoxide as an electrically conductive agent. As such, it is a problem that the added carbon nanotubes are not uniformly dispersed and distributed in the particles of the silicon monoxide. In a third way, amorphous carbon is deposited on the surface of silicon monoxide. However, the amorphous carbon has poorer electrical conductivity over carbon nanotubes, and has a low strength, and hence volume variations of the silicon monoxide in the reaction may not be effectively suppressed.

To solve or at least partially solve the above problem, the embodiments of the present disclosure provide a method for preparing a silicon monoxide composite material. Carbon nanotubes may be grown on the surface of silicon monoxide under a catalytic effect of an in-situ catalyst. As compared with the conventional way of growing the carbon nanotubes, no additional catalyst needs to be used, and there is no need to remove the catalyst by additional processes. The carbon nanotubes uniformly cover on the surface of the silicon monoxide, and a good electrically conductive network is established, such that the electrical conductivity and the initial coulombic efficiency of the silicon monoxide are improved. When the silicon monoxide composite material is applied to the negative electrode of the lithium ion battery, the theoretical capacity of the graphite negative electrode may be increased, and the energy density of the lithium ion battery may be enhanced. In addition, the carbon nanotubes may also act as a buffer agent, thereby reducing the volume variations of the lithium ion battery during charging and discharging.

A method for preparing the silicon monoxide composite material according to an embodiment of the present disclosure includes:

a first stage: introducing a protective gas into a vapor deposition oven, and pre-heating a silicon monoxide raw material, such that a part of the silicon monoxide raw material is subjected to a disproportionation reaction;

a second stage: continuously introducing the protective gas and introducing a carbon source gas, and subjecting the pre-heated silicon monoxide raw material to a chemical vapor deposition to form carbon nanotubes on a surface of silicon monoxide; and a third stage: after a predetermined time period, stopping introducing the carbon source gas, and stopping introducing the protective gas until the vapor deposition oven is cooled to room temperature, to prepare the silicon monoxide composite material.

In the first stage, the silicon monoxide raw material having a diameter in the range of 100 nm to 100 μm is placed into the vapor deposition oven. Silicon monoxide is not stable and may be oxidized in the air to silica. Therefore, in the process of pre-heating the silicon monoxide raw material, a protective gas needs to be introduced. The protective gas may be an inert gas. For example, the protective gas is nitrogen, argon, helium, or the like, and the inert gas has a flow rate in the range of 0.5 to 2 L/min.

The pre-heating process is carried out under a temperature in the range of 600 to 2000° C. and a duration in the range of 0 to 4 hours (timing is started after a predetermined pre-heating temperature is reached) at a temperature raising rate in the range of 1 to 10° C./min. In addition, a rotation speed of the vapor deposition oven is controlled to be in the range of 0.2 to 5.0 rpm. In the pre-heating process, part of the silicon monoxide raw material is subjected to disproportionation reaction to generate silica and stand-alone silicon. The generated silica and stand-alone silicon are co-existent on the surface of the silicon monoxide, and may act as a matrix and a catalyst for growing the carbon nanotubes subsequently.

In the second stage, the carbon source gas is decomposed and precipitated to form tubular carbon nanotubes under a catalytic effect of the catalyst particles, which are the product of the previous disproportionation reaction, not any extra catalysts. The carbon source gas is a small-molecule carbon-containing organic having not more than 6 carbon atoms. For example, the carbon source gas is one of methane, ethane, propane, butane, ethylene, propylene, acetylene, propyne, or liquefied petroleum gas, or any mixture thereof. A flow rate of the carbon source gas is in the range of 1 to 10 L/min, and a ratio of the flow rate of the inert gas to the flow rate of the carbon source gas is in the range of 2:1 to 10:1. The rotation speed of the vapor deposition oven is controlled to be in the range of 0.1 to 5.0 rpm.

The chemical vapor deposition is carried out under a temperature in the range of 600 to 2000° C. and a duration in the range of 0.1 to 10 hours (timing is started after a predetermined deposition temperature is reached), wherein the temperature of the chemical vapor deposition is equal to or higher than the temperature of the pre-heating process. It may be understood that if the temperature of the chemical vapor deposition is higher than the temperature of the pre-heating process, before the flow rate of the protective gas is adjusted and the carbon source gas is introduced, the temperature needs to be first raised to the predetermined deposition temperature.

In the second stage, in addition to forming the carbon nanotubes on the surface of the silicon monoxide, it is inevitable that a small amount of amorphous carbon is formed on the surface of the silicon monoxide. A carbon coating layer including the carbon nanotubes and the amorphous carbon is half covered on or totally covered on the surface of the silicon monoxide. The generated carbon nanotubes have a diameter in the range of 20 to 500 nm, a mass ratio of the carbon nanotubes to the silicon monoxide is in the range of 1.0% to 50%. Optionally, the thickness of the carbon coating layer formed of the carbon nanotubes and the amorphous carbon is 1 to 10 μm.

Optionally, the scope of the carbon nanotubes in the carbon coating layer on the surface of the silicon monoxide by 51%-99 wt. %, and the amorphous carbon by 1%-49 wt. %.

In some embodiments, the temperature of the pre-heating process is in the range of 600 to 1000° C., and the temperature of the chemical vapor deposition is equal to the temperature of the pre-heating process. That is, upon completion of the first stage, the carbon source gas may be directly introduced, and the flow rate of the protective gas may be directly adjusted.

As illustrated in FIG. 1, a is powder of the prepared silicon monoxide composite material, b is powder of the silicon monoxide raw material. As seen from FIG. 1, the powder of the silicon monoxide raw material is brown, whereas upon the vapor deposition reaction, the obtained powder of the silicon monoxide composite material is black. This indicates that carbon is generated on the surface of silicon monoxide and thus the surface becomes black.

Figure 2:
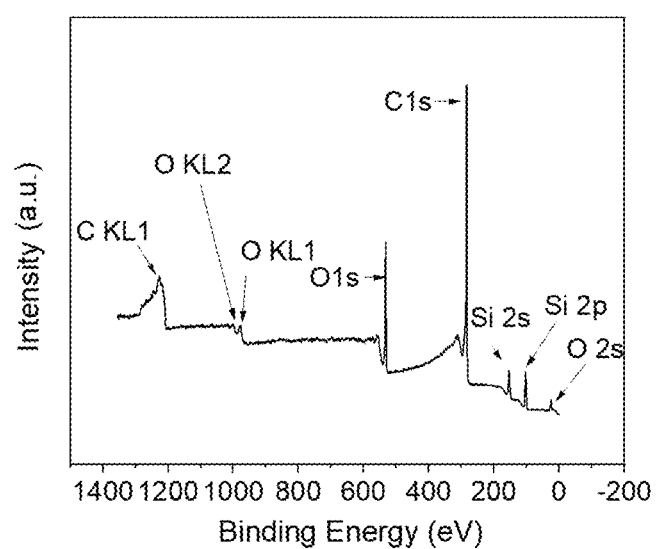
FIG. 2 illustrates an X-ray photoelectron spectroscopy of a silicon monoxide composite material prepared according to an example of the present disclosure.

As illustrated in FIG. 2, the X-ray photoelectron spectroscopy further reveals that in addition to a series of characteristic peaks of oxygen element (O) and silicon element (Si) contained in the silicon monoxide composite material, the characteristic peak of carbon element (Cis) is clearly seen. In this case, it is determined that the black substance on the surface of the silicon monoxide is carbon.

Figure 3:
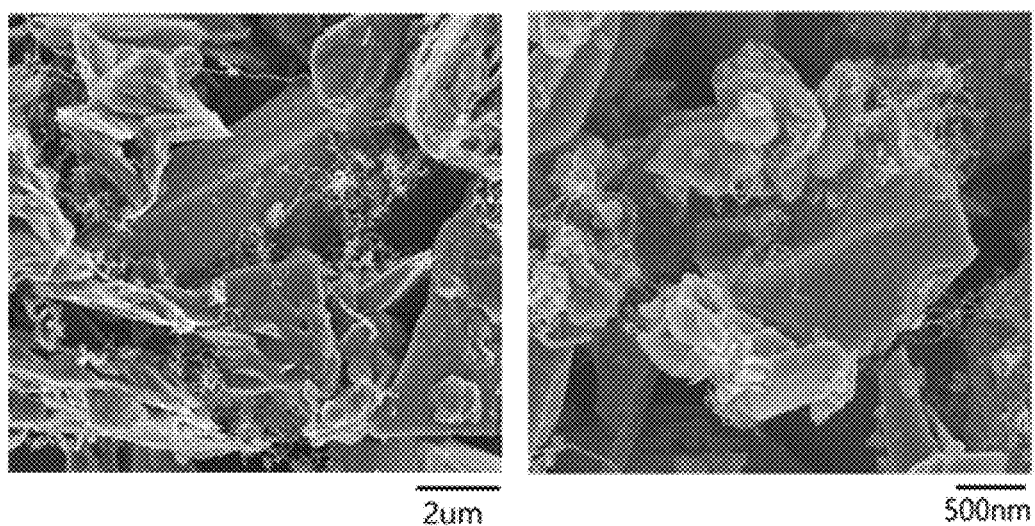
FIG. 3 illustrates scanning electron micrographs of a silicon monoxide composite material prepared according to an example of the present disclosure.

FIG. 3 illustrates morphologies of the carbon nanotubes grown on the surface of the silicon monoxide under different conditions. By a scanning electron microscope, it can be clearly seen that the carbon nanotubes are wound on the surface of the silicon monoxide.

Figure 4:
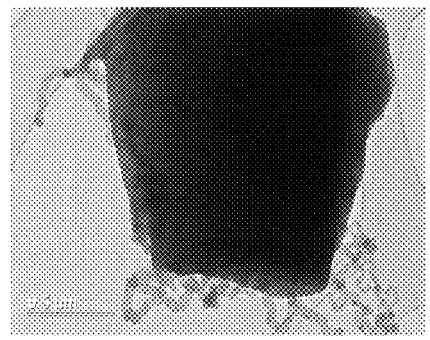
FIG. 4 illustrates a transmission electron micrograph of a silicon monoxide composite material prepared according to an example of the present disclosure.
Figure 5:
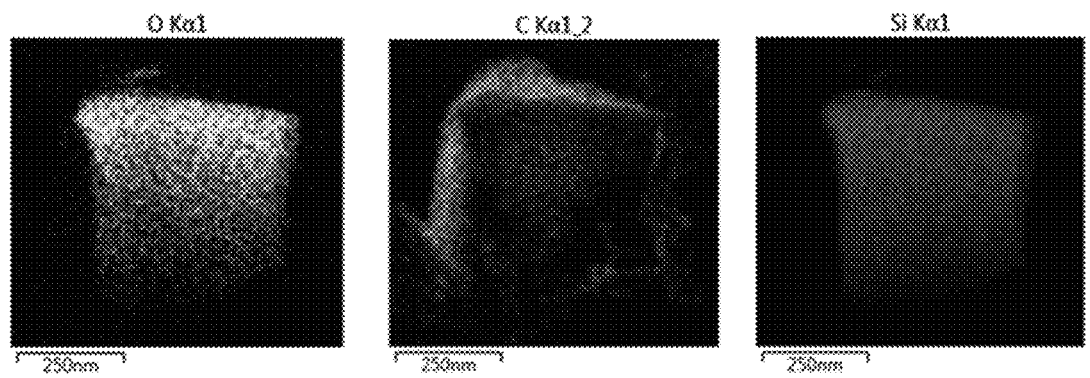
FIG. 5 illustrates element analysis pictures of a silicon monoxide composite material prepared according to an example of the present disclosure.

Referring to FIG. 4 and FIG. 5 together, FIG. 4 further illustrates distribution of the carbon nanotubes on the particles of the silicon monoxide by a transmission electron micrograph, and more clearly presents the morphology and tube diameter of the carbon nanotubes; and FIG. 5 illustrates element analysis pictures showing distributions of elements O, C, and Si, which are consistent with the elements illustrated in FIG. 2.

Figure 6:
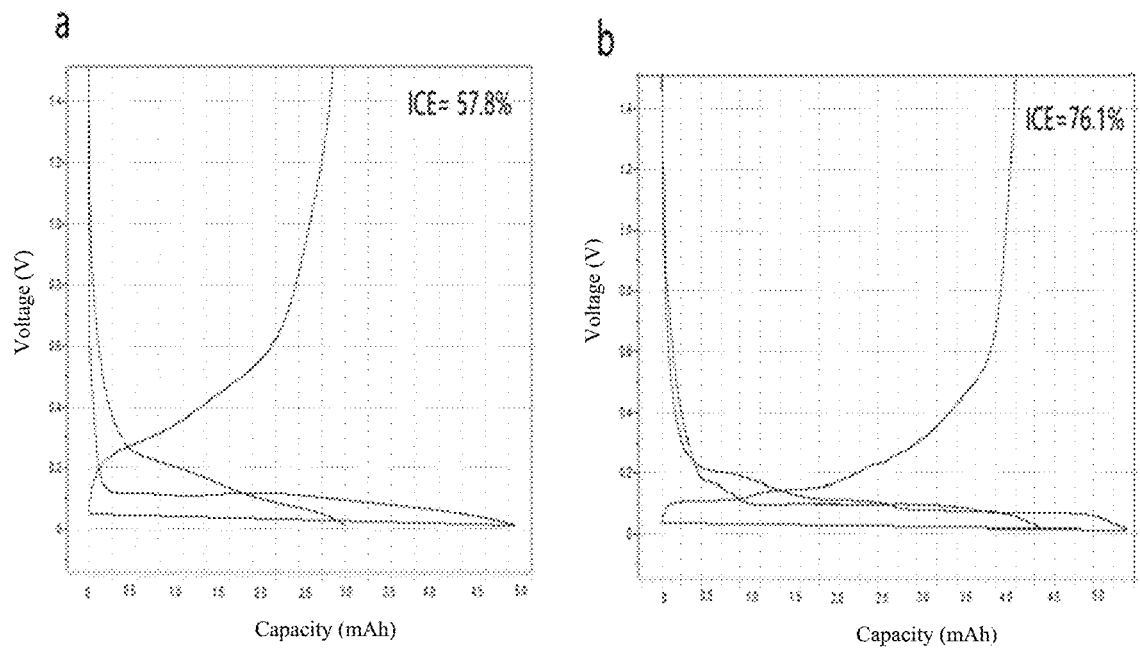
FIG. 6 illustrates initial coulombic efficiencies of a silicon monoxide composite material prepared according to an example of the present disclosure.

FIG. 6 illustrates the initial coulombic efficiency (ICE) of the silicon monoxide raw material, namely pure silicon monoxide, is 57.8%, and the initial ICE of the silicon monoxide composite material prepared in the embodiments of the present disclosure is 76.1%. Apparently, growing the carbon nanotubes on the surface of silicon monoxide significantly improves the initial coulombic efficiency of the silicon monoxide.

Figure 7:
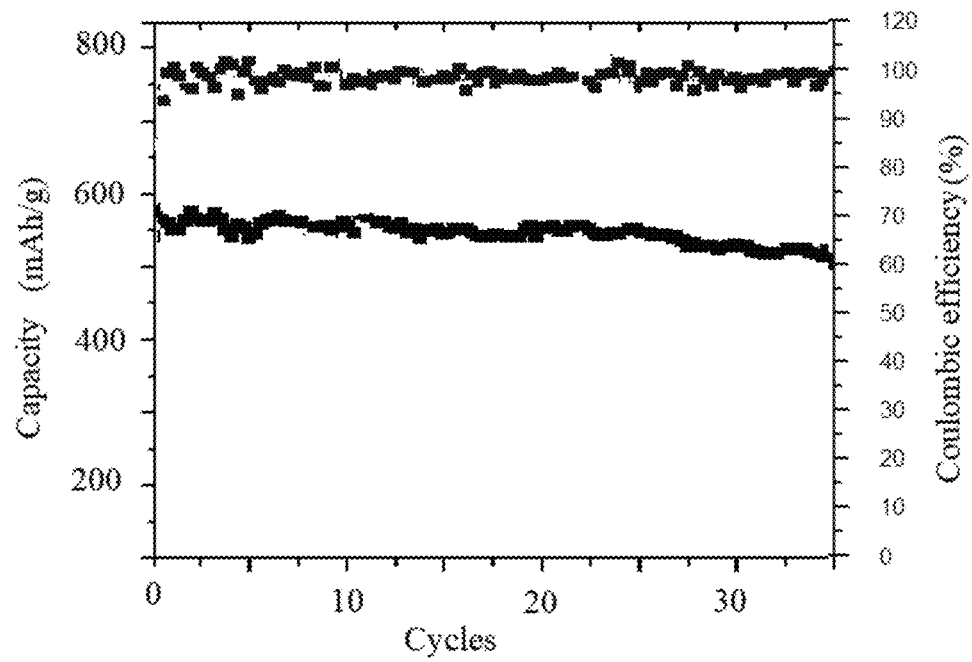
FIG. 7 illustrates cyclic charging and discharging of a lithium ion battery using silicon monoxide composite material-graphite as a negative electrode material.

The silicon monoxide composite material prepared according to the embodiments of the present disclosure may be mixed with graphite to prepare a negative electrode material for the lithium ion batteries. The specific mixing ratio may be defined by a person skilled in the art according to actual needs. For example, for a higher specific capacity of the negative electrode material, a relatively larger amount of the silicon monoxide composite material needs to be added; and for a higher coulombic efficiency of the negative electrode material, a relatively larger amount of the graphite needs to be added. As illustrated in FIG. 7, in the embodiments of the present disclosure, after the silicon monoxide composite material and the graphite are mixed at a mixing ratio of 1:2 to 1:6, the capacity of the obtained negative electrode material may be over 500 mAh/g (0.15C), and the initial coulombic efficiency thereof may be over 90%.

The technical solutions of the present disclosure are hereinafter described in detail with reference to the specific examples.

Example 1

1 kg of silicon monoxide raw material with a diameter of 100 nm to 100 μm was placed into a vapor deposition oven, nitrogen was introduced at a flow rate of 2 L/min into the oven to exclude the air inside, the oven was then heated to 600° C. at a temperature raising speed of 2° C./min, and a rotation speed of the vapor deposition oven was controlled to 1 rpm; the oven was maintained at 600° C. for 1 hour; the nitrogen was continuously introduced at the flow rate of 2 L/min and meanwhile methane was introduced at a flow rate of 1 L/min, and the rotation speed of the vapor deposition oven was controlled to 2 rpm.

8 hours later, introduction of methane was stopped, and introduction of nitrogen was stopped until the vapor deposition oven was cooled to room temperature. Finally, the silicon monoxide composite material was prepared.

Example 2

1 kg of silicon monoxide raw material with a diameter of 100 nm to 100 μm was placed into a vapor deposition oven, nitrogen was introduced at a flow rate of 1 L/min into the oven to exclude the air inside, the oven was then heated to 800° C. at a temperature raising speed of 5° C./min, and a rotation speed of the vapor deposition oven was controlled to 2 rpm; the oven was maintained at 800° C. for 0.5 hours; then the oven was heated to 1000° C. at a temperature raising speed of 10° C./min; after the temperature reached to 1000° C., the flow rate of the nitrogen was adjusted to 5 L/min and meanwhile methane was introduced at a flow rate of 1 L/min, and the rotation speed of the vapor deposition oven was controlled to 0.5 rpm.

3 hours later, introduction of methane was stopped, and introduction of nitrogen was stopped until the vapor deposition oven was cooled to room temperature. Finally, the silicon monoxide composite material was prepared.

Example 3

1 kg of silicon monoxide raw material with a diameter of 100 nm to 100 μm was placed into a vapor deposition oven, nitrogen was introduced at a flow rate of 1 L/min into the oven to exclude the air inside, the oven was then heated to 1000° C. at a temperature raising speed of 10° C./min, and a rotation speed of the vapor deposition oven was controlled to 1 rpm; the oven was maintained at 1000° C. for 3 hour; then the flow rate of the nitrogen was adjusted to 15 L/min and meanwhile liquefied petroleum gas was introduced at a flow rate of 2 L/min, and the rotation speed of the vapor deposition oven was controlled to 3 rpm.

3 hours later, introduction of liquefied petroleum gas was stopped, and introduction of nitrogen was stopped until the vapor deposition oven was cooled to room temperature. Finally, the silicon monoxide composite material was prepared.

Example 4

1 kg of silicon monoxide raw material with a diameter of 100 nm to 100 μm was placed into a vapor deposition oven, nitrogen was introduced at a flow rate of 0.5 L/min into the oven to exclude the air inside, the oven was then heated to 1200° C. at a temperature raising speed of 10° C./min, and a rotation speed of the vapor deposition oven was controlled to 4 rpm; after the temperature reached to 1200° C., the oven was continuously heated to 1500° C. at the temperature raising speed of 10° C./min; after the temperature reached to 1500° C., the flow rate of the nitrogen was adjusted to 15 L/min and meanwhile liquefied petroleum gas was introduced at a flow rate of 5 L/min, and the rotation speed of the vapor deposition oven was controlled to 4 rpm.

1 hours later, introduction of liquefied petroleum gas was stopped, and introduction of nitrogen was stopped until the vapor deposition oven was cooled to room temperature. Finally, the silicon monoxide composite material was prepared.

Described above are exemplary embodiments of the present disclosure, but are not intended to limit the scope of the present disclosure. Any equivalent structure or equivalent process variation made based on the specification and drawings of the present disclosure, which is directly or indirectly applied in other related technical fields, fall within the scope of the present disclosure.

What is claimed is:

1. A method for preparing a silicon monoxide composite material, comprising:
   a first stage: introducing a protective gas into a vapor deposition oven, and pre-heating a silicon monoxide raw material, such that a part of the silicon monoxide raw material is subjected to a disproportionation reaction;
   a second stage: continuously introducing the protective gas and introducing a carbon source gas, and subjecting the pre-heated silicon monoxide raw material to a chemical vapor deposition to form carbon nanotubes on a surface of silicon monoxide; and a third stage: after a predetermined time period, stopping introducing the carbon source gas, and stopping introducing the protective gas until the vapor deposition oven is cooled to room temperature, to prepare the silicon monoxide composite material.

2. The method according to claim 1, wherein
at the first stage, a pre-heating process is carried out under a temperature in the range of 600 to 2000° C. and a duration in the range of 0 to 4 hours, at a temperature raising speed in the range of 1 to 10° C./min; and
the protective gas is an inert gas, wherein a flow rate of the inert gas is in the range of 0.5 to 2 L/min.

3. The method according to claim 2, wherein
at the second stage, the chemical vapor deposition is carried out under a temperature in the range of 600 to 2000° C. and a duration in the range of 0.1 to 10 hours, wherein the temperature of the chemical vapor deposition is equal to or higher than the temperature of the pre-heating process; and
the carbon source gas is a small-molecule carbon-containing organic containing not more than 6 carbon atoms, and a flow rate of the carbon source gas is in the range of 1 to 10 L/min, wherein a ratio of the flow rate of the inert gas to the flow rate of the carbon source gas is in the range of 2:1 to 10:1.

4. The method according to claim 3, wherein
the temperature of the pre-heating process is in the range of 600 to 1000° C., wherein the temperature of the chemical vapor deposition is equal to the temperature of the pre-heating process.

5. The method according to claim 3, wherein
the carbon source gas is one of methane, ethane, propane, butane, ethylene, propylene, acetylene, propyne, or liquefied petroleum gas, or any mixture thereof.

6. The method according to claim 1, wherein the silicon monoxide raw material has a diameter in the range of 100 nm to 100 μm.

7. The method according to claim 1, wherein
at the first stage, a rotation speed of the vapor deposition oven is in the range of 0.2 to 5.0 rpm; and
at the second stage, the rotation speed of the vapor deposition oven is in the range of 0.1 to 5.0 rpm.

8. A silicon monoxide composition material, wherein a surface of silicon monoxide is partially covered or totally covered with a carbon coating layer comprising carbon nanotubes and amorphous carbon, wherein the carbon nanotubes have a diameter in the range of 20 to 500 nm, and a mass ratio of the carbon nanotubes to the silicon monoxide is in the range of 1.0% to 50%; wherein, when the silicon monoxide composition material is mixed with graphite to form a negative electrode material, the negative electrode material has a capacity of 500 mAh/g, and an initial coulombic efficiency greater than 90%;
a method for preparing the silicon monoxide composite material comprises:
a first stage: introducing a protective gas into a vapor deposition oven, and pre-heating a silicon monoxide raw material, such that a part of the silicon monoxide raw material is subjected to a disproportionation reaction;
a second stage: continuously introducing the protective gas and introducing a carbon source gas, and subjecting the pre-heated silicon monoxide raw material to a chemical vapor deposition to form carbon nanotubes catalyzed by the product from the disproportionation reaction in the first stage on a surface of silicon monoxide; and a third stage: after a predetermined time period, stopping introducing the carbon source gas, and stopping introducing the protective gas until the vapor deposition oven is cooled to room temperature, to prepare the silicon monoxide composite material.

9. The silicon monoxide composite material according to claim 8, wherein a scope of the carbon nanotubes in the carbon coating layer on the surface of silicon monoxide by 51%-99 wt. %, and the amorphous carbon by 1%-49 wt. %.

10. The silicon monoxide composite material according to claim 8, wherein at the first stage, a pre-heating process is carried out under a temperature in the range of 600 to 2000° C. and a duration in the range of 0 to 4 hours, at a temperature raising speed in the range of 1 to 10° C./min; and
the protective gas is an inert gas, wherein a flow rate of the inert gas is in the range of 0.5 to 2 L/min.

11. The silicon monoxide composite material according to claim 10, wherein
at the second stage, the chemical vapor deposition is carried out under a temperature in the range of 600 to 2000° C. and a duration in the range of 0.1 to 10 hours, wherein the temperature of the chemical vapor deposition is equal to or higher than the temperature of the pre-heating process; and
the carbon source gas is a small-molecule carbon-containing organic containing not more than 6 carbon atoms, and a flow rate of the carbon source gas is in the range of 1 to 10 L/min, wherein a ratio of the flow rate of the inert gas to the flow rate of the carbon source gas is in the range of 2:1 to 10:1.

12. The silicon monoxide composite material according to claim 11, wherein the temperature of the pre-heating process is in the range of 600 to 1000° C., wherein the temperature of the chemical vapor deposition is equal to the temperature of the pre-heating process.

13. The silicon monoxide composite material according to claim 11, wherein
the carbon source gas is one of methane, ethane, propane, butane, ethylene, propylene, acetylene, propyne, or liquefied petroleum gas, or any mixture thereof.

14. A lithium ion battery, wherein a negative electrode material of the lithium ion battery is prepared by mixing graphite with a silicon monoxide composition material, wherein a surface of silicon monoxide is partially covered or totally covered with a carbon coating layer comprising carbon nanotubes and amorphous carbon, wherein the carbon nanotubes have a diameter in the range of 20 to 500 nm, and a mass ratio of the carbon nanotubes to the silicon monoxide is in the range of 1.0% to 50%; wherein the negative electrode material has a capacity of 500 mAh/g, and an initial coulombic efficiency greater than 90%;
a method for preparing the silicon monoxide composite material comprises:
a first stage: introducing a protective gas into a vapor deposition oven, and pre-heating a silicon monoxide raw material, such that a part of the silicon monoxide raw material is subjected to a disproportionation reaction;
a second stage: continuously introducing the protective gas and introducing a carbon source gas, and subjecting the pre-heated silicon monoxide raw material to a chemical vapor deposition to form carbon nanotubes catalyzed by the product from the disproportionation reaction in the first stage on a surface of silicon monoxide; and a third stage: after a predetermined time period, stopping introducing the carbon source gas, and stopping introducing the protective gas until the vapor deposition oven is cooled to room temperature, to prepare the silicon monoxide composite material.

15. The lithium ion battery according to claim 14, wherein a scope of the carbon nanotubes in the carbon coating layer on the surface of silicon monoxide by 51%-99 wt. %, and the amorphous carbon by 1%-49 wt. %.

16. The lithium ion battery according to claim 14, wherein
at the first stage, a pre-heating process is carried out under a temperature in the range of 600 to 2000° C. and a duration in the range of 0 to 4 hours, at a temperature raising speed in the range of 1 to 10° C./min; and
the protective gas is an inert gas, wherein a flow rate of the inert gas is in the range of 0.5 to 2 L/min.

17. The lithium ion battery according to claim 16, wherein
at the second stage, the chemical vapor deposition is carried out under a temperature in the range of 600 to 2000° C. and a duration in the range of 0.1 to 10 hours, wherein the temperature of the chemical vapor deposition is equal to or higher than the temperature of the pre-heating process; and
the carbon source gas is a small-molecule carbon-containing organic containing not more than 6 carbon atoms, and a flow rate of the carbon source gas is in the range of 1 to 10 L/min, wherein a ratio of the flow rate of the inert gas to the flow rate of the carbon source gas is in the range of 2:1 to 10:1.

18. The lithium ion battery according to claim 17, wherein the temperature of the pre-heating process is in the range of 600 to 1000° C., wherein the temperature of the chemical vapor deposition is equal to the temperature of the pre-heating process.

19. The lithium ion battery according to claim 17, wherein the carbon source gas is one of methane, ethane, propane, butane, ethylene, propylene, acetylene, propyne, or liquefied petroleum gas, or any mixture thereof.

* * * * *